(12) United States Patent
Unnikrishnan et al.

(10) Patent No.: US 10,914,701 B2
(45) Date of Patent: Feb. 9, 2021

(54) SYSTEMS AND METHODS FOR DETERMINING ROTOR DETERIORATION IN A DYNAMOELECTRIC MACHINE

(71) Applicant: General Electric Company, Schenectady, NY (US)

(72) Inventors: Sunil Unnikrishnan, Hyderabad (IN); Sreedhar Desabhatla, Garching b. Munchen (DE); Pradeep Kumar Vavilala, Hyderabad (IN); Vamshi Krishna Kandula, Hyderabad (IN)

(73) Assignee: General Electric Company, Schenectady, NY (US)

( * ) Notice: Subject to any disclaimer, the term of this patent is extended or adjusted under 35 U.S.C. 154(b) by 257 days.

(21) Appl. No.: 15/626,708

(22) Filed: Jun. 19, 2017

(65) Prior Publication Data

US 2017/0363559 A1 Dec. 21, 2017

(30) Foreign Application Priority Data

Jun. 21, 2016 (IN) .............................. 201641021321

(51) Int. Cl.
*G01N 27/20* (2006.01)
*G01R 31/34* (2020.01)
(Continued)

(52) U.S. Cl.
CPC ............ *G01N 27/20* (2013.01); *G01M 15/14* (2013.01); *G01R 31/34* (2013.01); *G01R 31/343* (2013.01);
(Continued)

(58) Field of Classification Search
CPC ...... G01R 23/16; G01R 31/34; G01R 31/343; G01R 31/346; G01N 27/04; G01N 27/20
See application file for complete search history.

(56) References Cited

U.S. PATENT DOCUMENTS

| 4,761,703 A | 8/1988 | Kliman et al. |
| 4,812,751 A | 3/1989 | Roberts et al. |

(Continued)

FOREIGN PATENT DOCUMENTS

| CN | 205246758 U | 5/2016 |
| EP | 1 356 308 A2 | 10/2003 |

(Continued)

OTHER PUBLICATIONS

"IEEE Standard for the Repair and Rewinding of AC Electric Motors in the Petroleum, Chemical, and Process Industries," IEEE Std 1068-2009 (Revision of IEEE Std 1068-1996), pp. 1-97 (Mar. 17, 2010).

(Continued)

*Primary Examiner* — Leslie J Evanisko
*Assistant Examiner* — Leo T Hinze
(74) *Attorney, Agent, or Firm* — James Pemrick; Hoffman Warnick LLC

(57) ABSTRACT

Embodiments of the disclosure are directed at determining rotor deterioration in a dynamoelectric machine. Various current and voltage measurements are carried out upon an exciter assembly when the dynamoelectric machine is operated at various speeds and at various occasions over an extended period of time. More particularly, a set of current and voltage measurements that are carried out when the dynamoelectric machine is in a slow-roll mode of operation can be used for determining a resistance of a current path through which the exciter assembly provides electrical power to a rotor assembly. A time-domain-to-frequency-domain conversion can be carried out upon this set of resistance measurements in order to generate a spectral signature. The spectral signature can then be evaluated to detect an altered rotor resistance condition and/or a rotor resistance alteration trend.

17 Claims, 7 Drawing Sheets

(51) Int. Cl.
*H02K 11/20* (2016.01)
*G01M 15/14* (2006.01)
*G01R 23/16* (2006.01)

(52) U.S. Cl.
CPC ........... *G01R 31/346* (2013.01); *H02K 11/20* (2016.01); *G01R 23/16* (2013.01)

(56) References Cited

U.S. PATENT DOCUMENTS

| | | | |
|---|---|---|---|
| 5,592,393 | A | 1/1997 | Yalla |
| 6,035,265 | A | 3/2000 | Dister et al. |
| 6,199,018 | B1 * | 3/2001 | Quist ................. G01M 13/028 318/806 |
| 6,280,265 | B1 | 8/2001 | Hopeck et al. |
| 6,323,658 | B1 * | 11/2001 | Kendig ................ G01R 31/343 324/546 |
| 6,483,319 | B1 | 11/2002 | Kendig et al. |
| 6,794,879 | B2 | 9/2004 | Lawson et al. |
| 7,034,706 | B1 | 4/2006 | Nippes |
| 7,834,573 | B2 | 11/2010 | Lindsey et al. |
| 8,384,338 | B2 | 2/2013 | Lu et al. |
| 8,405,339 | B2 | 3/2013 | Zhang et al. |
| 8,762,104 | B2 | 6/2014 | Hedin |
| 8,810,396 | B2 | 8/2014 | Hedin |
| 8,812,265 | B2 | 8/2014 | Hedin |
| 9,200,980 | B2 | 12/2015 | Hedin |
| 2009/0219030 | A1 | 9/2009 | Salem et al. |
| 2011/0301872 | A1 | 12/2011 | Hedin |
| 2012/0072136 | A1 | 3/2012 | Hedin |
| 2013/0030742 | A1 | 1/2013 | Banerjee et al. |
| 2013/0149102 | A1 * | 6/2013 | Marcucci ................ F04D 17/10 415/1 |
| 2014/0365176 | A1 | 12/2014 | Hedin |
| 2015/0260794 | A1 | 9/2015 | Athikessavan et al. |
| 2016/0033580 | A1 * | 2/2016 | Qiao .................... G01R 31/343 324/765.01 |
| 2016/0266208 | A1 * | 9/2016 | Athikessavan ..... H02P 29/0241 |

FOREIGN PATENT DOCUMENTS

| | | |
|---|---|---|
| EP | 2 370 800 A1 | 10/2011 |
| EP | 2 370 801 A1 | 10/2011 |
| EP | 2 373 961 A1 | 10/2011 |
| EP | 2 373 971 A1 | 10/2011 |
| EP | 2 427 745 A1 | 3/2012 |
| EP | 2 392 070 B1 | 3/2013 |
| EP | 2 725 370 B1 | 1/2015 |
| EP | 2 919 027 A1 | 9/2015 |
| GB | 2 493 280 A | 1/2013 |
| WO | 2002/039642 A2 | 5/2002 |
| WO | 2010/074643 A1 | 7/2010 |
| WO | 2010/074645 A1 | 7/2010 |
| WO | 2010/074646 A1 | 7/2010 |
| WO | 2010/074648 A1 | 7/2010 |
| WO | 2010/086729 A2 | 8/2010 |
| WO | 2010/128928 A1 | 11/2010 |
| WO | 2014/063784 A1 | 5/2014 |
| WO | 2014/117279 A1 | 8/2014 |
| WO | 2014/146422 A1 | 9/2014 |

OTHER PUBLICATIONS

Extended European Search Report and Opinion issued in connection with corresponding EP Application No. 17176928.4 dated Nov. 29, 2017.

* cited by examiner

US 10,914,701 B2

SYSTEMS AND METHODS FOR DETERMINING ROTOR DETERIORATION IN A DYNAMOELECTRIC MACHINE

TECHNICAL FIELD

This disclosure relates to dynamoelectric machines, and more particularly, to systems and methods for determining rotor deterioration in a dynamoelectric machine.

BACKGROUND

Dynamoelectric machines, particularly gas turbines that are used as prime movers in power generation systems for generating electric power, are complex machines having a large number of components. Many of these components are subjected to continuous movement over extended periods of time thus exposing them to significant wear and tear. Pre-emptive monitoring/repair/maintenance operations can be performed, particularly on moving components, to prevent a costly interruption of service as a result of an unexpected breakdown.

Unfortunately, in many cases it is quite difficult to accurately determine an extent of gradual wear and tear of various components of a dynamoelectric machine over an extended period of time, particularly with respect to moving components that are subjected to a variety of stresses under a variety of operating conditions. For example, a rotor assembly of a gas turbine can deteriorate gradually over time after the gas turbine has been operated at a variety of speeds and operating conditions. In conventional practice the extent of the deterioration of the rotor assembly may be assessed on a periodic basis (such as on a yearly basis) in order to detect any faults or degradation in the rotor assembly. These assessments can involve carrying out various types of resistance measurements on stationary rotor components to identify faults such as short-circuits, open-circuits, poor electrical conductivity, and/or poor insulation.

However, as can be understood, such a conventional assessment, which is often carried out when the gas turbine is in a planned shut-down state, is not necessarily reliable or pertinent under dynamic conditions when for example, the rotor is subjected to a variety of stress conditions including friction, pressure, and centrifugal force. Such a conventional assessment can also fail to predict in a quantitative and analytical manner, one or more potential defects that may lead to a sudden failure of the gas turbine in the future.

BRIEF DESCRIPTION OF THE DISCLOSURE

Embodiments of the disclosure are generally directed to systems and methods for determining component deterioration in various types of machines incorporating high speed rotating components that can wear down over time. It should be understood that the various types of entities encompassed in accordance with the disclosure are not limited solely to dynamoelectric machines used for electric power generation, but can also be pertinent to many other types of machines incorporating parts such as electric motors, synchronous motors, and other types of motors. More particularly, certain embodiments of the disclosure can provide a technical effect and/or solution for determining rotor deterioration in a dynamoelectric machine. Towards this end, in some embodiments, various current and voltage measurements can be carried out upon an exciter assembly that provides electrical power to a field winding of a rotor. The current and voltage measurements can be used for deriving resistance values associated with the exciter assembly and the rotor when a gas turbine is operated at various speeds at various occasions over an extended period of time (years, for example). In one example implementation, a first set of resistance values can be derived when the gas turbine is first placed in service and operated at various speeds. Presumably, at this time, the gas turbine is in pristine condition and the rotor has undergone no wear and tear. A second set of resistance values can be derived later on, including for example, when the gas turbine is in a slow-roll mode of operation. The slow-roll mode of operation is generally used to prevent a portion of the gas turbine, particularly a main shaft of the gas turbine, from sagging under its own weight if left in a stationary state. A time-domain-to-frequency-domain conversion is carried out upon each of the first set of resistance values and the second set of resistance values. Due to the pristine condition of the gas turbine, a first spectral signature that can be obtained from the first set of resistance values would typically indicate no harmonic components. However, based on an extent of rotor deterioration, a second spectral signature obtained from the second set of resistance values can include one or more harmonic components. A comparison of the first spectral signature against the second spectral signature can provide an indication of an extent of alteration in resistance parameters of the rotor assembly between the time the gas turbine was first placed in service and later on when the rotor deterioration detection procedure is executed. Furthermore, the detected alteration in resistance can be combined with other parameters, such as number of start-ups of the gas turbine, the amount of time that the gas turbine has been operated in the slow-roll mode of operation, and/or speed parameters, to determine a rotor deterioration trend. The rotor deterioration trend can be used to predict future events, such as failures and/or breakdowns, and can also be used to carry out pre-emptive operations such as a maintenance procedure, a calibration procedure, or a repair procedure.

According to one exemplary embodiment of the disclosure, a system can include a dynamoelectric machine and a rotor deterioration detecting system. The dynamoelectric machine can include a field winding and an exciter assembly comprising a slip ring. The exciter assembly is configured to provide direct current (DC) power to the field winding via the slip ring. The rotor deterioration detecting system can include a resistance measurement unit, a time-domain-to-frequency-domain converter, a spectral analysis system, a rotor deterioration calculator, and a graphical user interface. The resistance measurement unit can be used for generating a resistance values log that includes resistance values measured between the slip ring and the field winding at various intervals when the dynamoelectric machine is in operation. The time-domain-to-frequency-domain converter can use at least a portion of the resistance values log to generate a spectral signature of a rotor resistance measurement that is carried out when the dynamoelectric machine is subjected to a slow-roll mode of operation. The spectral analysis system can determine a level of alteration in rotor resistance based at least in part, on evaluating one or more harmonic components when present in the spectral signature generated by the time-domain-to-frequency-domain converter. The rotor deterioration calculator can output at least one of an altered rotor resistance condition of the dynamoelectric machine during the slow-roll mode of operation, or a rotor resistance alteration trend of the dynamoelectric machine, based at least in part, on processing the level of alteration in rotor resistance determined by the spectral analysis system. The graphical user interface can be used for displaying at least one of the altered rotor resistance condition or the rotor resistance alteration trend, and for accepting a user input associated with the rotor deterioration detecting system.

According to another exemplary embodiment of the disclosure, a method includes providing a dynamoelectric machine that includes a field winding and an exciter assembly, the exciter assembly having a slip ring for providing direct current (DC) power to the field winding; generating a resistance values log that includes resistance values measured between the slip ring and the field winding at various intervals when the dynamoelectric machine is in operation; using at least a portion of the resistance values log to generate a spectral signature of a rotor resistance measurement that is carried out when the dynamoelectric machine is subjected to a slow-roll mode of operation; determining a level of alteration in rotor resistance based at least in part, on evaluating one or more harmonic components when present in the spectral signature; determining at least one of an altered rotor resistance condition of the dynamoelectric machine during the slow-roll mode of operation, or a rotor resistance alteration trend of the dynamoelectric machine, based at least in part, on processing the level of alteration in rotor resistance; and carrying out at least one of a repair procedure or a maintenance procedure upon one or more components of the dynamoelectric machine based on the at least one of the altered rotor resistance condition or the rotor resistance alteration trend.

According to yet another exemplary embodiment of the disclosure, a non-transitory computer-readable storage medium has stored thereon, instructions executable by a computer for performing operations that can include: generating a resistance values log that includes resistance values measured between a slip ring and a field winding of a dynamoelectric machine at various intervals when the dynamoelectric machine is in operation; using at least a portion of the resistance values log to generate a spectral signature of a resistance measurement that is carried out when the dynamoelectric machine is subjected to a slow-roll mode of operation; determining a level of alteration in rotor resistance based at least in part, on evaluating one or more harmonic components when present in the spectral signature; determining at least one of an altered rotor resistance condition of the dynamoelectric machine during the slow-roll mode of operation, or a rotor resistance alteration trend of the dynamoelectric machine, based at least in part, on processing the level of alteration in rotor resistance; and displaying on a display of a graphical user interface, the at least one of the altered rotor resistance condition or the rotor resistance alteration trend.

Other embodiments and aspects of the disclosure will become apparent from the following description taken in conjunction with the following drawings.

BRIEF DESCRIPTION OF THE DRAWINGS

Figure 1:
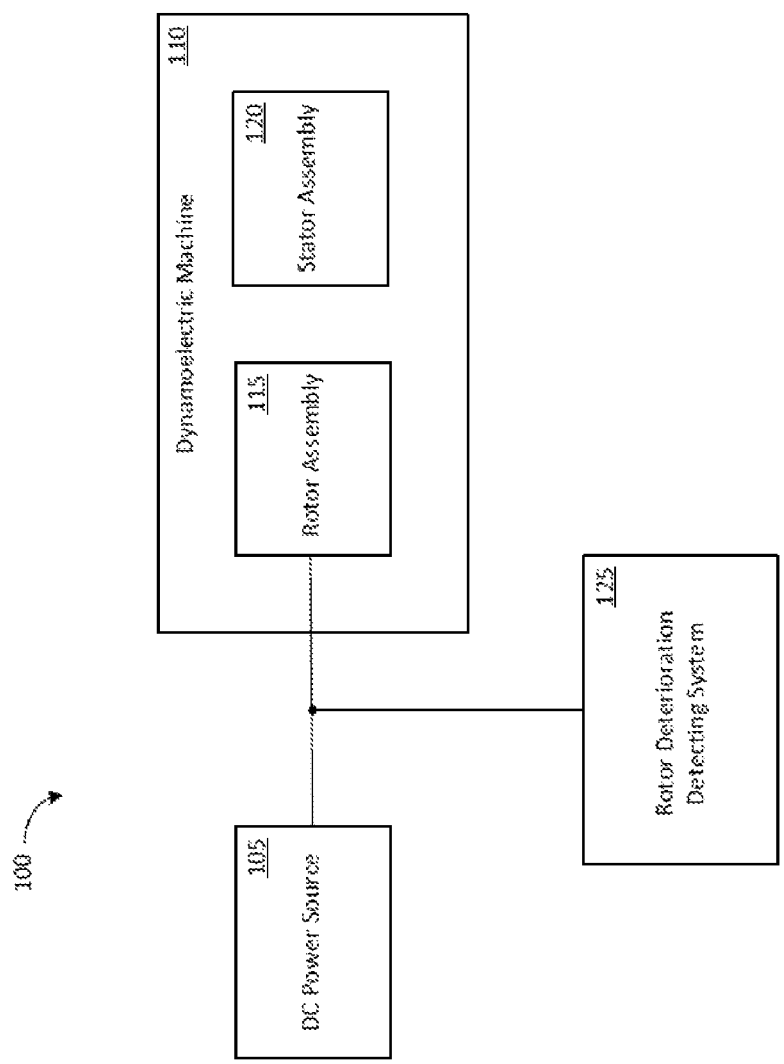

Having thus described the disclosure in general terms, reference will now be made to the accompanying drawings, which are not necessarily drawn to scale, and wherein:

FIG. 1 shows a simplified representation of an example rotor deterioration detecting system coupled to a dynamoelectric machine in accordance with one exemplary embodiment of the disclosure.

Figure 2:
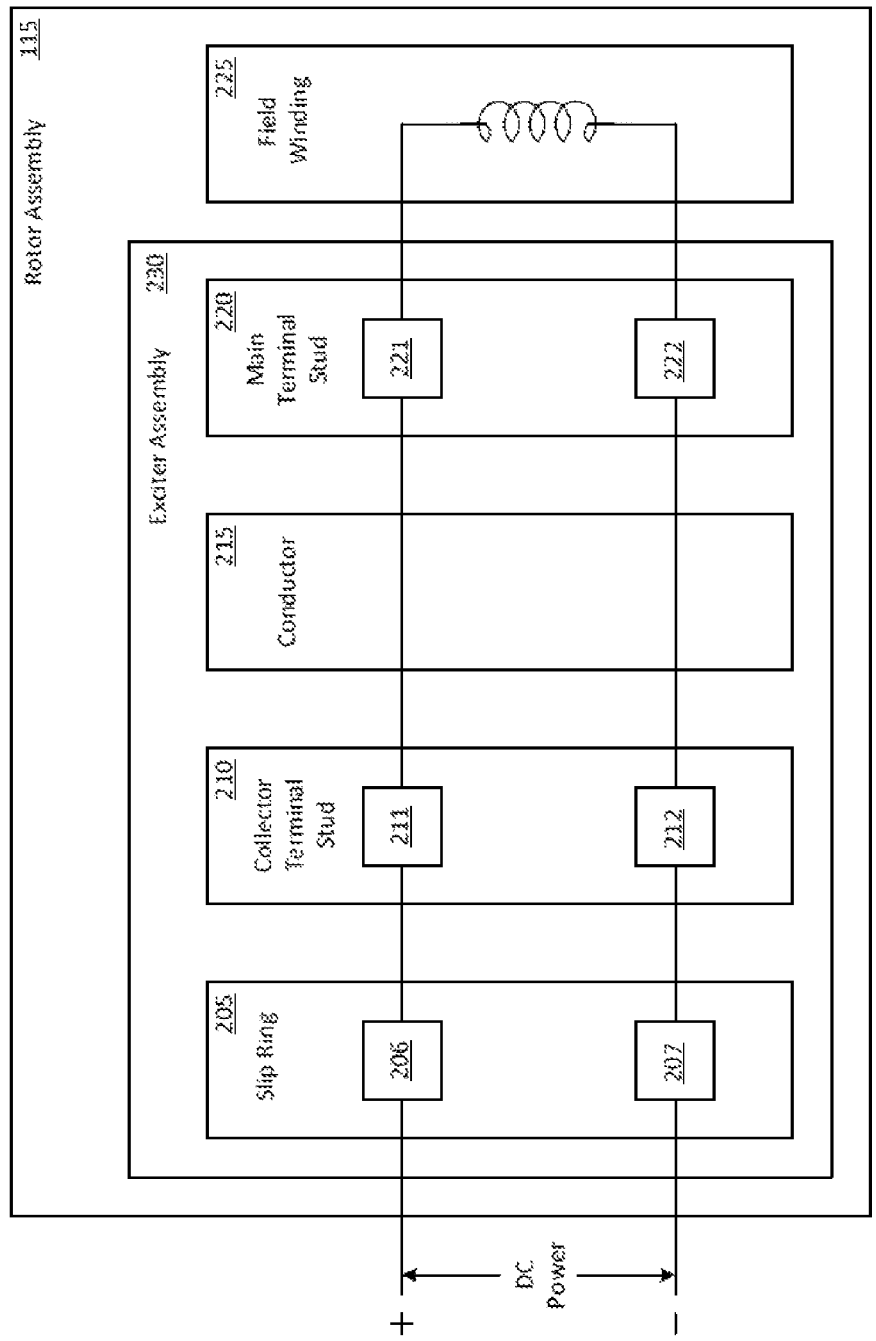

FIG. 2 shows an example rotor assembly that can be a part of the dynamoelectric machine shown in FIG. 1.

Figure 3:
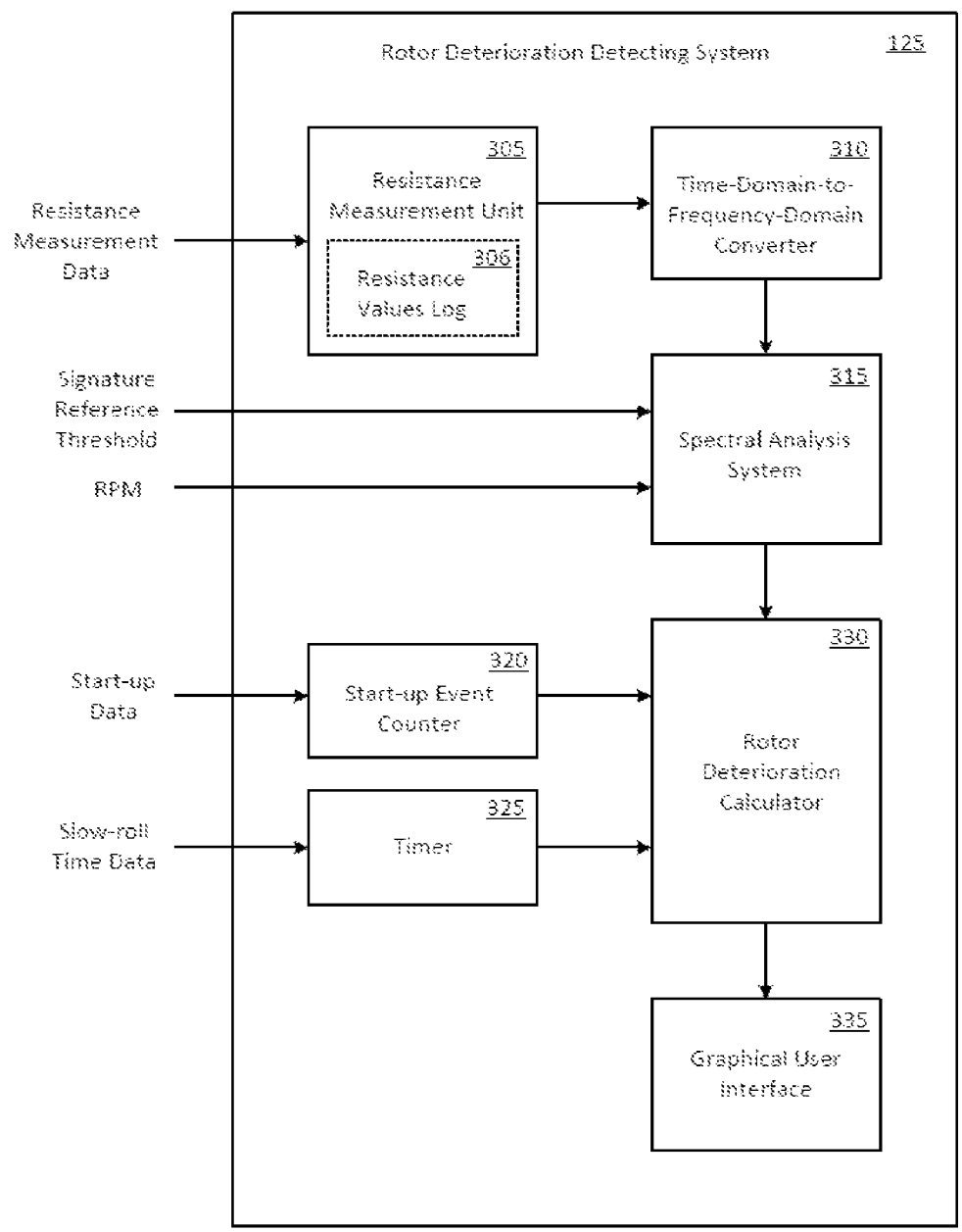

FIG. 3 shows some exemplary components of a rotor deterioration detecting system in accordance with an exemplary embodiment of the disclosure.

Figure 4:
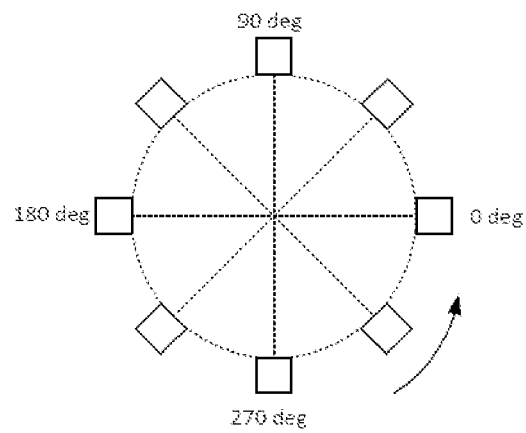

FIG. 4 illustrates various angular positions of a rotor, which can be a part of the dynamoelectric machine shown in FIG. 1.

Figure 5:
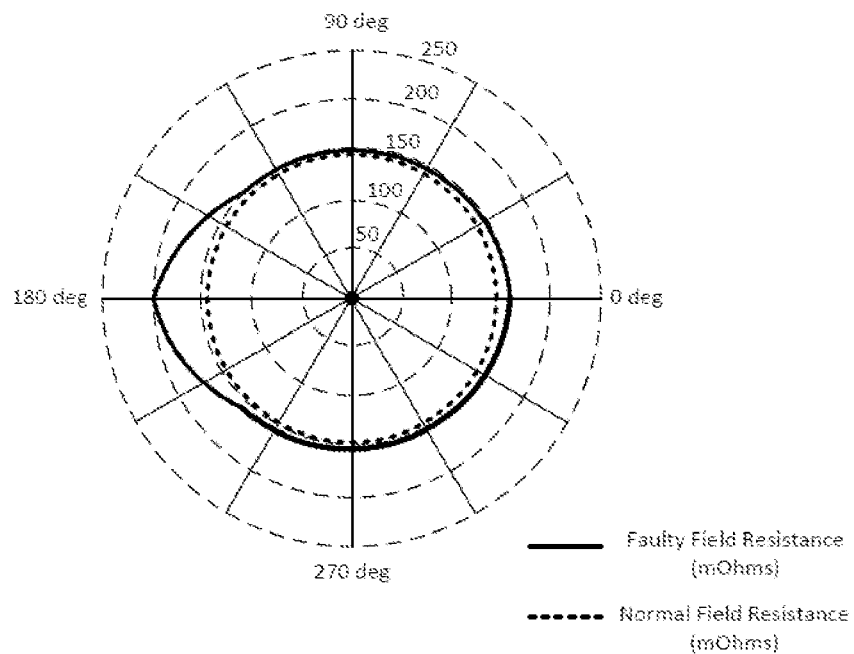

FIG. 5 illustrates an exemplary polar plot of a first set of field resistance values associated with a faulty field winding and a second set of field resistance values associated with a normal field winding.

Figure 6:
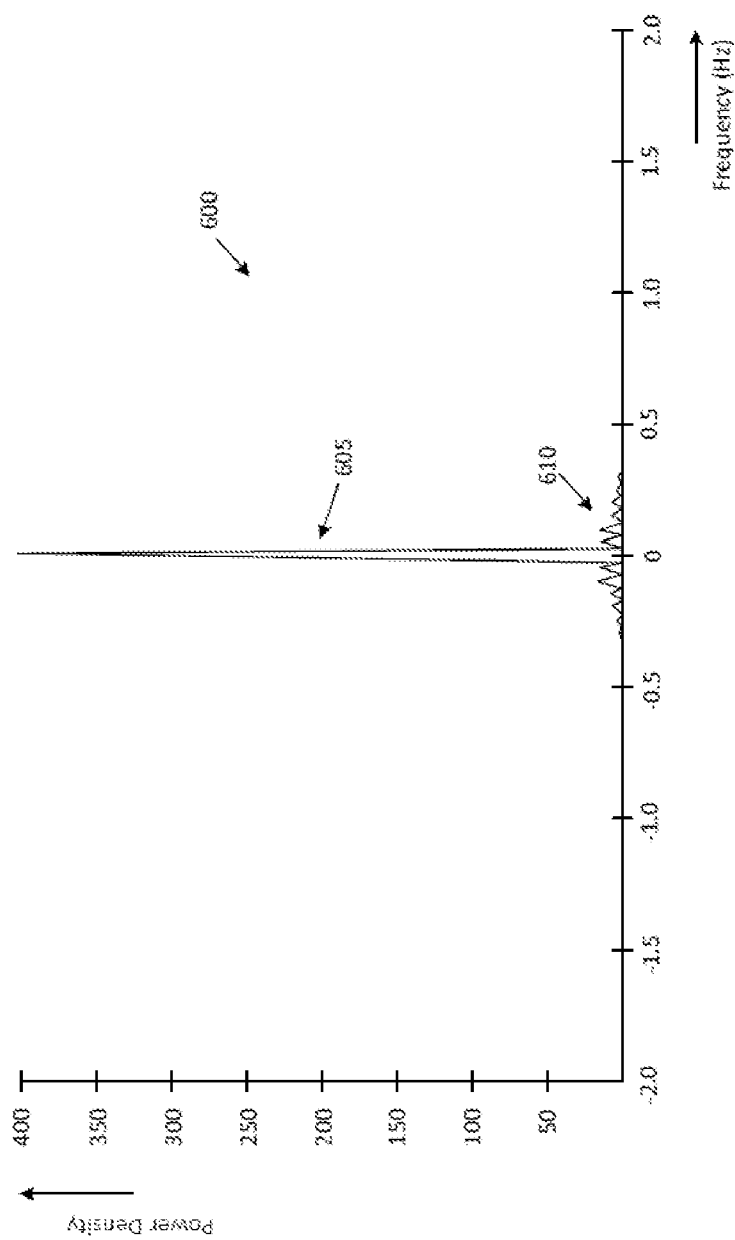

FIG. 6 illustrates an example spectral signature associated with a resistance condition when a dynamoelectric machine is subjected to a slow-roll mode of operation in accordance with an exemplary embodiment of the disclosure.

Figure 7:
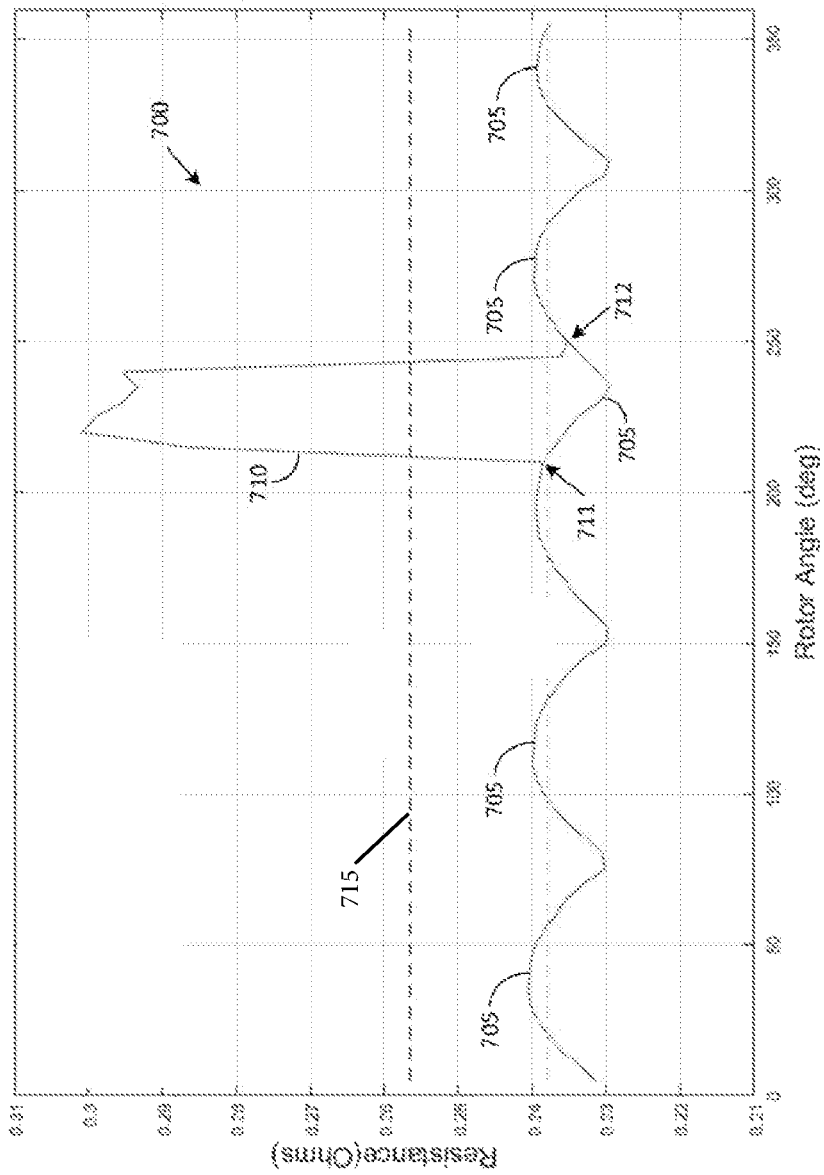

FIG. 7 illustrates an exemplary graph indicating a relationship between various rotor angles and resistance values for a faulty rotor and a normal rotor, in accordance with an exemplary embodiment of the disclosure.

Figure 8:
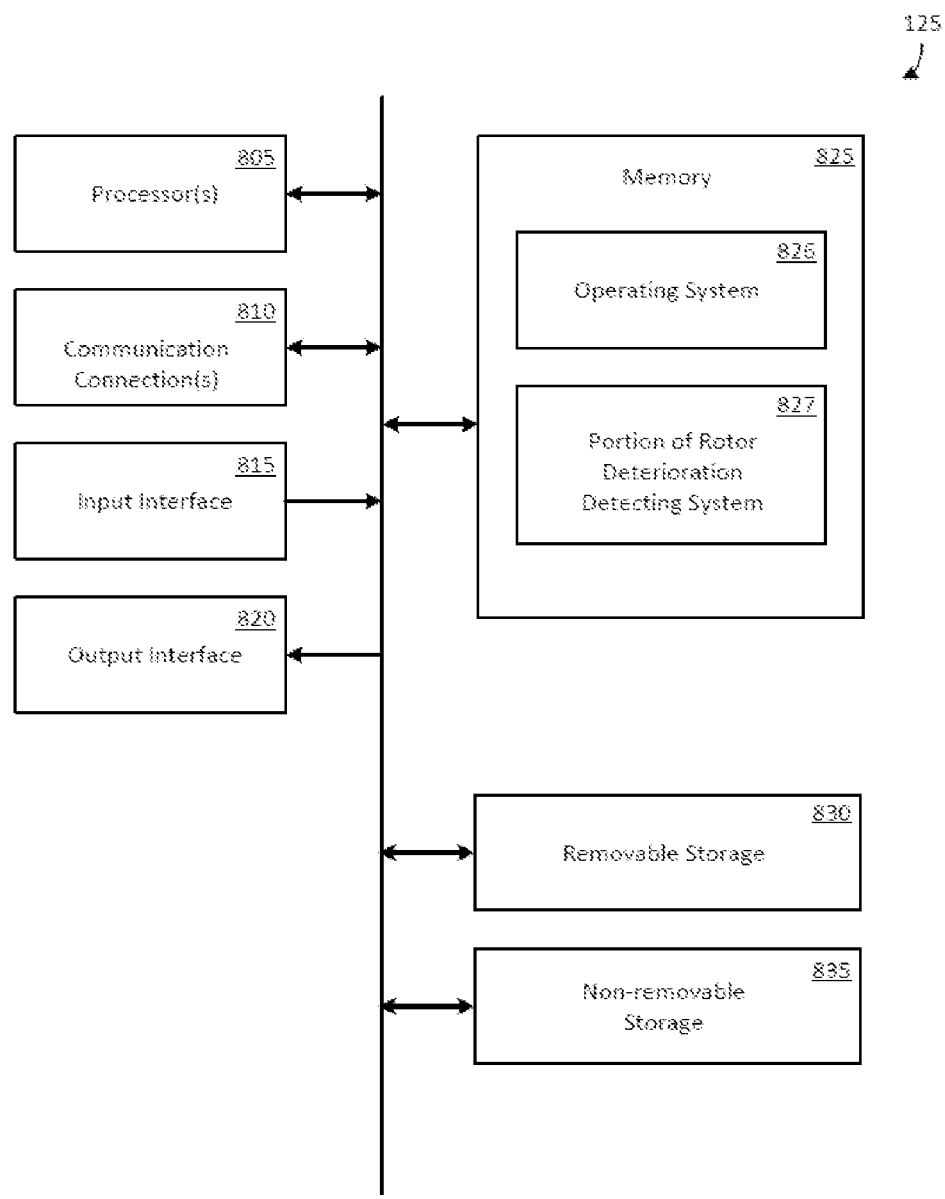

FIG. 8 shows some exemplary components of another rotor deterioration detecting system in accordance with another exemplary embodiment of the disclosure.

DETAILED DESCRIPTION

The disclosure will be described more fully hereinafter with reference to the accompanying drawings, in which exemplary embodiments of the disclosure are shown. This disclosure may, however, be embodied in many different forms and should not be construed as limited to the exemplary embodiments set forth herein; rather, these embodiments are provided so that this disclosure will satisfy applicable legal requirements. Like numbers refer to like elements throughout. It should be understood that certain words and terms are used herein solely for convenience and such words and terms should be interpreted as referring to various objects and actions that are generally understood in various forms and equivalencies by persons of ordinary skill in the art. It should be understood that the words "example" and "exemplary" as used herein are intended to be non-exclusionary and non-limiting in nature. More particularly, the word "exemplary" as used herein indicates one among several examples, and it should be understood that no undue emphasis or preference is being directed to the particular example being described.

Attention is first drawn to FIG. 1, which shows a simplified representation of an example system 100 that includes a rotor deterioration detecting system 125 coupled to a dynamoelectric machine 110 in accordance with one exemplary embodiment of the disclosure. More particularly, the rotor deterioration detecting system 125 can be coupled to a rotor assembly 115 of the dynamoelectric machine 110. The rotor assembly 115 can be provided with direct current (DC) power from a DC power source 105. In one example implementation, a turning gear (not shown) can be used to rotate a main shaft of the dynamoelectric machine 110 at a relatively slow speed. The slow-speed rotation, which is directed at minimizing or eliminating sag that can occur due to gravity acting upon a heavy, unmoving main shaft, is generally referred to herein as a slow-roll mode of operation. The slow-roll mode of operation can be characterized for example, by shaft rotational speeds ranging from about 0.1% of full speed to about 10% of full speed. Transitioning from the slow-roll mode of operation to a full-speed mode of operation can be carried out by increasing the DC power provided by the DC power source 105 to the rotor assembly 115 in the form of an excitation voltage applied to an exciter assembly as described below in more detail. Various voltage and current measurements can be carried out in accordance with one or more embodiments of the disclosure during the time the excitation voltage is applied to increase the rotational speed from the slow-roll speed to about 90% of full-speed. The interaction of the rotor assembly 115 with a stator assembly 120 of the dynamoelectric machine 110 is known in the art. However, certain features of the rotor assembly 115 that may be more pertinent to understanding some portions of the disclosure will be elaborated upon below using other figures.

FIG. 2 shows an exciter assembly 230 that can be a part of the rotor assembly 115. In this example embodiment, the exciter assembly 230 can include a slip ring 205, a collector terminal stud (CTS) 210, an electrical conductor 215, a main terminal stud (MTS) 220, and a field winding 225. DC power can be coupled into the slip ring 205 from the DC power source 105 (shown in FIG. 1) using various connection attributes that are known in the art. The slip ring 205 shown in FIG. 2 is a symbolic representation of a slip ring assembly that can include multiple contacts, such as multiple metal rings that are electrically isolated from each other. A first contact 206 of the slip ring 205 can be coupled to a positive terminal of the DC power source 105 and a second contact 207 can be coupled to a negative terminal of the DC power source 105. The first contact 206 of the slip ring 205 is connected to a first contact 211 of the CTS 210 such that the positive polarity voltage present at the first contact 206 of the slip ring 205 is also present at the collector contact 211 of the CTS 210. The second contact 207 of the slip ring 205 is connected to a second collector contact 212 of the CTS 210 such that the negative polarity voltage present at the second contact 207 of the slip ring 205 is also present at the second collector contact 212 of the CTS 210. The conductor 215 is a symbolic representation of two or more electrical conductors (wires, cables, metal bars, metal strips etc.) that interconnect the CTS 210 with the MTS 220. The first contact 221 of the MTS 220 is connected to a first end of the field winding 225 and the second contact 222 of the MTS 220 is connected to an opposing end of the field winding 225. As a result of this connection, a DC current can flow through the field winding 225 from the first end to the opposing end. The magnitude of the current flowing through the field winding 225 determines the speed of rotation of the rotor assembly 115 and is controllable by varying the magnitude of the DC voltage provided by the DC power source 105.

It can be understood that various components of the exciter assembly 230 can be moving parts (such as metal brushes, metal fingers, metal rings, metal pads etc.) that provide electrical connectivity between the DC power source 105 and the field winding 225. These moving parts can suffer from wear and tear over time. For example, a metal brush may deteriorate over time and lead to a reduction in contact pressure against a slip ring. The reduction in contact pressure can be characterized as an increase in contact resistance that results in a reduction in electrical current carrying capacity between the metal brush and the slip ring. As another example, a pair of moving contacts can lose alignment with each other over time and result in a reduction in electrical current carrying capacity. In some cases, non-moving parts can also contribute to a reduction in electrical current carrying capacity. For example, a nut used for anchoring a cable to a stud may be loosened as a result of vibrations.

Irrespective of the cause, any reduction in electrical current carrying capacity between any portion of the electrical path between the DC power source 105 and the field winding 225 can be understood to represent an increase in electrical path resistance. Such an increased electrical path resistance is generally referred to herein as an altered rotor resistance condition. The altered rotor resistance condition can be caused due to a variety of reasons. For example, a deterioration in the rotor assembly 115 can lead to an increase in clearance between a stationary part and a rotating part of the rotor assembly 115. This increase in clearance may not necessarily lead to a reduction in electrical current flow between the rotating part and the stationary part when the rotor assembly 115 is operated at higher speeds because centrifugal forces can push the rotating part against the stationary part and provide satisfactory contact pressure. However, at slower speeds, particularly at speeds corresponding to the slow-roll mode of operation where centrifugal forces are significantly lower and a larger clearance exists between the stationary part and the rotating part, the larger clearance and the corresponding increase in electrical path resistance can significantly impact operations of the rotor assembly 115. Consequently, in one or more embodiments in accordance with the disclosure, various current and voltage measurements can be carried out during the slow-roll mode of operation. More particularly, various current and voltage measurements can be carried out at various angular positions of the rotor assembly 115 during the slow-roll mode of operation. These measurements can then be converted into spectral domain parameters that can be analyzed as disclosed herein to assess an extent of rotor deterioration.

Attention is now drawn to FIG. 3, which shows some exemplary components of the rotor deterioration detecting system 125 in accordance with an exemplary embodiment of the disclosure. The various components can be implemented using hardware, software, firmware, or any combinations thereof. For example, the resistance measurement unit 305 can be implemented using a combination of hardware elements (a voltmeter, a current sensor, and an analog-to-digital converter, for example) and software elements (such as a software calculator that calculates resistance values from current and voltage values provided in a digital format by the analog-to-digital converter), while the resistance values log 306 can be defined in the form of a database. Similarly, the start-up event counter 320 can be implemented either as a hardware counter or a software counter, and the timer 325 can be implemented either as a hardware timer or a software timer.

In terms of functionality, the resistance measurement unit 305 can be used to create the resistance values log 306, which can include various resistance values measured between the slip ring 205 (shown in FIG. 2) and the field winding 225 (shown in FIG. 2) at various intervals when the dynamoelectric machine 110 is in operation. For example, the resistance values log 306 can include resistance values measured on a periodic basis (every year or quarter, for example) and/or an intermittent/irregular basis (on the basis of a customer request, for example). It should be understood that the phrase "resistance value measurement" as used herein generally refers to direct measurement of resistance (using an ohmmeter, for example) as well as measurement procedures wherein resistance values are derived from voltage and current measurements carried out (using a voltmeter, or an ammeter, for example). The voltage and current measurements can be carried out upon various components such as the exciter assembly 230, the DC power source 105, and/or one or more electrical conductors used for coupling the DC power source 105 to the exciter assembly 230.

In one exemplary implementation, the resistance values log 306 can include a first set of resistance measurements that are performed when the dynamoelectric machine 110 is first placed in service and operated at various speeds (start-up speed, full-speed etc.). Presumably, at this time, the rotor assembly 115 of the dynamoelectric machine 110 is in pristine condition with substantially zero deterioration. This first set of resistance measurements can serve as a reference template that can be used in various ways to detect rotor deterioration over time and can also be used to determine a trend in such rotor deterioration. For example, the first set of resistance measurements can be used to generate a reference spectral signature and/or a signature reference threshold. Further aspects to the reference spectral signature and the signature reference threshold can be understood from the description provided below using other figures.

The time-domain-to-frequency-domain converter 310 can use at least a portion of the resistance values log 306 in order to generate a spectral signature of a rotor resistance measurement that is carried out when the dynamoelectric machine 110 is subjected to a slow-roll mode of operation.

The spectral analysis system 315 can be used to determine a level of alteration in rotor resistance based at least in part, on evaluating one or more harmonic components when present in the spectral signature generated by the time-domain-to-frequency-domain converter 310. The spectral analysis system 315 can also determine the level of alteration in rotor resistance based on additional parameters such as the signature reference threshold and speed data. The speed data (in rotations per minute, for example) can provide information pertaining to the operating mode of the dynamoelectric machine 110 including speed-related information pertaining to the slow-roll mode of operation.

The rotor deterioration calculator 330 can be used to output an altered rotor resistance condition of the dynamoelectric machine 110 during the slow-roll mode of operation. In one example implementation, the altered rotor resistance condition can be determined based on the extent of change in rotor resistance as determined by the spectral analysis system 315. The rotor deterioration calculator 330 can also be used to output a rotor resistance alteration trend of the dynamoelectric machine 110, based at least in part, on processing the level of alteration in rotor resistance (as determined by the spectral analysis system 315) and combining it with other parameters (such as provided by the start-up event counter 320 and the timer 325).

The start-up event counter 320 can provide a cumulative count of start-up operations conducted upon the dynamoelectric machine 125. As can be understood, a start-up operation generally includes various operational modes involving various rotational speeds of the rotor assembly 115. The timer 325 can provide a cumulative operating time measurement that is indicative of a total amount of time that the dynamoelectric machine 110 has been subjected to the slow-roll mode of operation.

The rotor deterioration detecting system 125 can further include a graphical user interface 335 that provides for human interaction with the rotor deterioration detecting system 125. For example, the graphical user interface 335 can be used for displaying information pertaining to the altered rotor resistance condition detected by the rotor deterioration calculator 330. Such information can include a warning alert when the altered rotor resistance condition can lead to a malfunction or breakdown of the dynamoelectric machine 110 if no action is taken to remedy the altered rotor resistance condition immediately. The warning alert can be provided in different formats (blue, orange, and red, for example) in accordance with the severity of the altered rotor resistance condition. A user of the graphical user interface 335 can take remedial action such as replacing a defective component in order to avoid a breakdown or altering a configuration of one or more components in order to improve an operational efficiency of the rotor assembly 115.

The graphical user interface 335 can be further used for displaying information pertaining to the rotor resistance alteration trend of the dynamoelectric machine 110. In some exemplary embodiments, the rotor resistance alteration trend can be presented via the graphical user interface 335, in the form of a predictive model that predicts a state of the dynamoelectric machine 110 over a future period of time. A user of the graphical user interface 335 can view the rotor resistance alteration trend and determine a rate of deterioration of the rotor assembly 115. Thus, for example if the rate of deterioration is relatively fast, the user can take remedial action quicker than when the rate of deterioration is slower.

Attention is next drawn to FIG. 4, which illustrates various angular positions of the rotor assembly 115 that can be a part of the dynamoelectric machine 110. The angular positions can be virtual in nature and can be used to mark various positions of the rotor assembly 115 when the dynamoelectric machine 110 is in various modes of operation at various instances over a period of time. Resistance values at each of these angular positions can be measured by the resistance measurement unit 305 and stored in the resistance values log 306.

FIG. 5 illustrates an exemplary polar plot of a first set of field resistance values (indicated by a solid line) that is associated with a faulty field winding and further illustrates a second set of field resistance values (indicated by a dashed line) that is associated with a normal field winding.

FIG. 6 illustrates an example spectral signature 600 associated with a resistance condition when the dynamoelectric machine 110 is subjected to a slow-roll mode of operation in accordance with an exemplary embodiment of the disclosure. When the rotor assembly 115 of the dynamoelectric machine 110 is in a pristine condition (such as when the dynamoelectric machine 110 is first placed in service and the rotor has undergone no wear and tear) the spectral signature 600 includes a spiked portion 605 but does not include harmonic components 610. However, after the rotor has suffered wear and tear over time, the rotor resistance gets altered and can lead to harmonic components 610 being present in the spectral signature 600. The spectral analysis system 315 described herein can be used to detect a level of alteration in rotor resistance based on evaluating the harmonic components 610 (amplitude, periodicity, frequency, bandwidth etc.). In some cases, the nature of the harmonic components 610 can be correlated to various angular positions of the rotor assembly 115.

FIG. 7 illustrates an exemplary graph 700 indicating a relationship between various rotor angles and resistance values for a faulty rotor and for a normal rotor. The graph 700 includes a first plot (indicated by reference designator 705) having resistance maxima and minima indicative of a rotor assembly 115 that is in a pristine condition. The horizontal dashed line 715 is indicative of a pristine resistance as can be obtained for example, from a data sheet of the dynamoelectric machine 110. The graph 700 also includes a second plot having maxima and minima that match several maxima and minima of the first plot. However, the second plot deviates from the first plot between points 711 and 712 where a vertical protrusion 710 can be seen. This vertical protrusion is indicative of an altered rotor resistance condition that can be quantified by the horizontal dashed line 710 that indicates a higher rotor resistance than that corresponding to the horizontal dashed line 715 (when the rotor was in a pristine condition). In one exemplary implementation, the horizontal dashed line 710 can correspond to a (mean+6 Sigma) altered resistance.

Attention is now drawn to FIG. 8, which illustrates some exemplary components of another embodiment of a rotor deterioration detecting system 125 in accordance with the disclosure. In this exemplary embodiment, the rotor deterioration detecting system 125 can include one or more input interfaces and output interfaces. Input interface 815 can be configured to receive various kinds of inputs such as resistance measurement data, start-up data, slow-roll time data, rotational speed, and a signature reference threshold. Output interface 820 can be configured for example, to output information to the graphical user interface 335 (shown in FIG. 3).

One or more processors, such as the processor 805, can be configured to communicatively cooperate with various elements contained in the rotor deterioration detecting system 125, including a memory 825. The processor 805 can be implemented and operated using appropriate hardware, software, firmware, or combinations thereof. Software or firmware implementations can include computer-executable or machine-executable instructions written in any suitable programming language to perform the various functions described. In one embodiment, instructions associated with a function block language can be stored in the memory 825 and executed by the processor 805.

The memory 825 can be used to store program instructions that are loadable and executable by the processor 805, as well as to store data generated during the execution of these programs. Depending on the configuration and type of the rotor deterioration detecting system 125, the memory 825 can be volatile (such as random access memory (RAM)) and/or non-volatile (such as read-only memory (ROM), flash memory, etc.). In some embodiments, the memory devices can also include additional removable storage 830 and/or non-removable storage 835 including, but not limited to, magnetic storage, optical disks, and/or tape storage. The disk drives and their associated computer-readable media can provide non-volatile storage of computer-readable instructions, data structures, program modules, and other data. In some implementations, the memory 825 can include multiple different types of memory, such as static random access memory (SRAM), dynamic random access memory (DRAM), or ROM.

The memory 825, the removable storage, and the non-removable storage are all examples of non-transient computer-readable storage media. Such non-transient computer-readable storage media can be implemented in any method or technology for storage of information such as computer-readable instructions, data structures, program modules or other data. Additional types of non-transient computer storage media that can be present include, but are not limited to, programmable random access memory (PRAM), SRAM, DRAM, ROM, electrically erasable programmable read-only memory (EEPROM), compact disc read-only memory (CD-ROM), digital versatile discs (DVD) or other optical storage, magnetic cassettes, magnetic tapes, magnetic disk storage or other magnetic storage devices, or any other medium which can be used to store the desired information and which can be accessed by the processor 805. Combinations of any of the above should also be included within the scope of non-transient computer-readable media.

Turning to the contents of the memory 825, the memory 825 can include, but is not limited to, an operating system (OS) and one or more application programs or services for implementing the features and aspects disclosed herein. Such applications or services can include software and/or firmware portions of the rotor deterioration detecting system 827.

Many modifications and other embodiments of the example descriptions set forth herein to which these descriptions pertain will come to mind having the benefit of the teachings presented in the foregoing descriptions and the associated drawings. Thus, it will be appreciated the disclosure may be embodied in many forms and should not be limited to the exemplary embodiments described above. Therefore, it is to be understood that the disclosure is not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed is:

1. A system comprising:
   a dynamoelectric machine comprising:
   an exciter assembly comprising:
   a slip ring;
   a collector terminal stud;
   an electrical conductor;
   a main terminal stud; and
   a field winding, the exciter assembly configured to provide direct current (DC) power to the field winding via the slip ring; and
   a rotor deterioration detecting system comprising:
   a resistance measurement unit for generating a resistance values log that includes: a first set of resistance values measured at each of a plurality of angular positions of the rotor assembly between the slip ring and the field winding at various intervals when the dynamoelectric machine is in operation when the dynamoelectric machine is at a substantially zero deterioration and a second set of resistance values after the dynamoelectric machine is used, wherein the angular positions include positions of the rotor assembly at various times when the dynamoelectric machine is in operation;
   a time-domain-to-frequency-domain converter that uses at least a portion of the resistance values log to generate a spectral signature of a rotor resistance measurement that is carried out when the dynamoelectric machine is subjected to a slow-roll mode of operation and transitioning to about 90% of a full-speed mode of operation including a first spectral signature from the first set of resistance values and a second spectral signature from the second set of resistance values, wherein each spectral signature is comprised of a series of a power density to frequency in Hz measurements at each angular position, wherein a slow-roll mode of operation includes a shaft rotational speed of about 0.1-10% of the full-speed mode of operation, wherein the transitioning includes increasing a direct current power to the rotor assembly, and wherein the direct current power is an excitation voltage applied to the exciter assembly;
   a spectral analysis system that compares the first spectral signature and the second spectral signature and determines a level of alteration in rotor resistance based at least in part, on evaluating one or more harmonic components when present in the spectral signatures generated by the time-domain-to-frequency-domain converter and correlates the evaluation of the harmonic components to the values of the angular positions;
   a rotor deterioration calculator that outputs at least one of an altered rotor resistance condition of the dynamoelectric machine during the slow-roll mode of operation, or a rotor resistance alteration trend of the dynamoelectric machine, based at least in part, on processing the level of alteration in rotor resistance determined by the spectral analysis system; and a graphical user interface for displaying at least one of the altered rotor resistance condition or the rotor resistance alteration trend, and for accepting a user input associated with the rotor deterioration detecting system, wherein the displaying is a plot of a series of resistances in Ohms to each of the angular positions in degrees.

2. The system of claim 1, wherein the rotor deterioration detecting system further comprises:

a start-up event counter that provides a cumulative count of start-up operations conducted upon the dynamoelectric machine; and a timer that provides a cumulative operating time measurement that is indicative of a total amount of time that the dynamoelectric machine has been subjected to the slow-roll mode of operation.

3. The system of claim 2, wherein the rotor deterioration calculator determines the resistance alteration trend based on processing a combination of at least a portion of the cumulative count of start-up operations, at least a portion of the cumulative operating time measurement, and the level of alteration in rotor resistance determined by the spectral analysis system.

4. The system of claim 2, wherein each of the plurality of resistance values is derived from DC voltage measurements and DC current measurements carried out, via the exciter assembly, at each of a set of predefined rotational speeds of the rotor assembly.

5. The system of claim 1, wherein the spectral analysis system determines the level of alteration in rotor resistance, at least in further part, by using a signature reference threshold that is derived from a first set of resistance measurements carried out when the dynamoelectric machine is first placed in service.

6. The system of claim 5, wherein the spectral analysis system indicates the level of alteration in rotor resistance as a percentage deterioration with respect to the signature reference threshold.

7. The system of claim 5, wherein the first set of resistance values is characterized at least in part, by an absence of harmonic components in a spectral representation.

8. The system of claim 7, wherein the signature threshold value comprises a threshold amplitude that is used by the spectral analysis system to determine the level of alteration in rotor resistance.

9. A method comprising:

providing a dynamoelectric machine comprising an exciter assembly, the exciter assembly comprising a slip ring; a collector terminal stud; an electrical conductor; a main terminal stud; and a field winding, the exciter assembly configured for providing direct current (DC) power to the field winding via the slip ring;

generating a resistance values log that includes a first set of resistance values at each of a plurality of angular positions of the rotor assembly measured between the slip ring and the field winding at various intervals when the dynamoelectric machine is in operation when the dynamoelectric machine is at a substantially zero deterioration and a second set of resistance values after the dynamoelectric machine is used, wherein the angular positions include positions of the rotor assembly at various times when the dynamoelectric machine is in operation;

using at least a portion of the resistance values log to generate a spectral signature of a rotor resistance measurement that is carried out when the dynamoelectric machine is subjected to a slow-roll mode of operation and transitioning to about 90% of a full-speed mode of operation including a first spectral signature from the first set of resistance values and a second spectral signature from the second set of resistance values, wherein each spectral signature is comprised of a series of a power density to frequency in Hz measurements at each angular position, wherein a slow-roll mode of operation includes a shaft rotational speed of about 0.1-10% of the full-speed mode of operation, wherein the transitioning includes increasing a direct current power to the rotor assembly, and wherein the direct current power is an excitation voltage applied to the exciter assembly;

comparing the first spectral signature and the second spectral signature;

determining a level of alteration in rotor resistance based at least in part, on evaluating one or more harmonic components when present in the spectral signature and correlating the evaluation of the harmonic components to the values of the angular positions;

determining at least one of an altered rotor resistance condition of the dynamoelectric machine during the slow-roll mode of operation, or a rotor resistance alteration trend of the dynamoelectric machine, based at least in part, on processing the level of alteration in rotor resistance;

carrying out at least one of a repair procedure or a maintenance procedure upon one or more components of the dynamoelectric machine based on the at least one of the altered rotor resistance condition or the rotor resistance alteration trend; and displaying on a display of a graphical user interface, the at least one of the altered rotor resistance condition or the rotor resistance alteration trend, wherein each spectral signature is comprised of a series of a power density to frequency in Hz measurements at each angular position.

10. The method of claim 9, further comprising:

generating a cumulative count of start-up operations conducted upon the dynamoelectric machine;

obtaining a cumulative operating time measurement that is indicative of a total amount of time that the dynamoelectric machine has been subjected to the slow-roll mode of operation; and determining the resistance alteration trend based on processing a combination of at least a portion of the cumulative count of start-up operations, at least a portion of the cumulative operating time measurement, and the level of alteration in rotor resistance.

11. The method of claim 10, wherein each of the plurality of resistance values is derived from DC voltage measurements and DC current measurements carried out, via the exciter assembly, at each of a set of predefined rotational speeds of the rotor assembly during the slow-roll condition.

12. The method of claim 9, wherein determining the level of alteration in rotor resistance is further based on using a signature reference threshold that is derived from a first set of resistance measurements carried out when the dynamoelectric machine is first placed in service.

13. The method of claim 12, wherein the first set of resistance values is characterized at least in part, by an absence of harmonic components in a spectral representation.

14. A non-transitory computer-readable storage medium having stored thereon, instructions executable by a computer for performing operations comprising:
- generating a resistance values log that includes a first set of resistance values at each of a plurality of angular positions of the rotor assembly measured between a slip ring and a field winding of a dynamoelectric machine at various intervals when the dynamoelectric machine is in operation when the dynamoelectric machine is at a substantially zero deterioration and a second set of resistance values after the dynamoelectric machine is used, wherein the angular positions include positions of the rotor assembly at various times when the dynamoelectric machine is in operation;
- using at least a portion of the resistance values log to generate a spectral signature of a resistance measurement that is carried out when the dynamoelectric machine is subjected to a slow-roll mode of operation and transitioning to about 90% of a full-speed mode of operation including a first spectral signature from the first set of resistance values and a second spectral signature from the second set of resistance values, wherein each spectral signature is comprised of a series of a power density to frequency in Hz measurements at each angular position, wherein a slow-roll mode of operation includes a shaft rotational speed of about 0.1-10% of the full-speed mode of operation, wherein the transitioning includes increasing a direct current power to the rotor assembly, and wherein the direct current power is an excitation voltage applied to the exciter assembly;
- comparing the first spectral signature and the second spectral signature;
- determining a level of alteration in rotor resistance based at least in part, on evaluating one or more harmonic components when present in the spectral signature and correlating the evaluation of the harmonic components to the values of the angular positions;
- determining at least one of an altered rotor resistance condition of the dynamoelectric machine during the slow-roll mode of operation, or a rotor resistance alteration trend of the dynamoelectric machine, based at least in part, on processing the level of alteration in rotor resistance; and
- displaying on a display of a graphical user interface, the at least one of the altered rotor resistance condition or the rotor resistance alteration trend, wherein each spectral signature is comprised of a series of a power density to frequency in Hz measurements at each angular position.

15. The non-transitory computer-readable storage medium of claim 14, wherein each of the plurality of resistance values is derived from DC voltage measurements and DC current measurements carried out, via an exciter assembly, at each of a set of predefined rotational speeds of the rotor assembly during the slow-roll condition.

16. The non-transitory computer-readable storage medium of claim 14, wherein determining the level of alteration in rotor resistance is further based on using a signature reference threshold that is derived from a first set of resistance measurements carried out when the dynamoelectric machine is first placed in service.

17. The non-transitory computer-readable storage medium of claim 16, wherein the first set of resistance values is characterized at least in part, by an absence of harmonic components in a spectral representation.

* * * * *